United States Patent [19]

Heyke

[11] 4,181,901
[45] Jan. 1, 1980

[54] METHOD FOR REGULATING THE OUTPUT POWER OF A SEMICONDUCTOR LASER

[75] Inventor: Hans-Joachim Heyke, Backnang, Fed. Rep. of Germany

[73] Assignee: Licentia Patent-Verwaltungs-G.m.b.H., Frankfurt, Fed. Rep. of Germany

[21] Appl. No.: 852,570

[22] Filed: Nov. 17, 1977

[30] Foreign Application Priority Data

Nov. 19, 1976 [DE] Fed. Rep. of Germany ....... 2652608

[51] Int. Cl.² .............................................. H01S 3/13
[52] U.S. Cl. ........................... 331/94.5 S; 250/211 J; 250/552; 307/312; 357/19; 357/30
[58] Field of Search ..................... 331/94.5 S, 94.5 H; 307/311, 312; 357/19, 30; 250/552, 211 J

[56] References Cited

U.S. PATENT DOCUMENTS

| | | | |
|---|---|---|---|
| 3,878,105 | 4/1975 | Palmer | 357/30 X |
| 3,996,526 | 12/1976 | d'Auria et al. | 331/94.5 S |
| 4,092,614 | 5/1978 | Sakuma et al. | 331/94.5 H X |

OTHER PUBLICATIONS

J. Muller et al., "Transparent Photodiodes for Optical Transmission Systems," Third European Conference on Optical Communication, Munich, Sep. 14–16, 1977, pp. 173-175.

*Primary Examiner*—James W. Davie
*Attorney, Agent, or Firm*—Spencer & Kaye

[57] ABSTRACT

Arrangement for regulating the output power of a semiconductor laser for a data transmission system including a light conductive fiber through which the laser power is transmitted and a photodiode which is responsive to light energy produced by the laser and whose output signal is utilized, possibly after appropriate amplification, to regulate the laser current. The photodiode is a thin-film photodiode which is transparent for the light frequencies to be transmitted via the light conductive fiber and is inserted in the light-conductive fiber used to transmit the signals.

9 Claims, 6 Drawing Figures

METHOD FOR REGULATING THE OUTPUT POWER OF A SEMICONDUCTOR LASER

BACKGROUND OF THE INVENTION

The present invention relates to an arrangement for regulating the output power of a semiconductor laser in a data transmission system, including a light conductive fiber, in which part of the laser power is tapped by means of photodiodes and is used, possibly after appropriate amplification, to regulate the laser circuit.

Due to temperature influences and aging processes in a semiconductor laser it is necessary to regulate its current in order to maintain constant output power. The prior art has accomplished this by utilizing the light power emanating on the rear side of the laser for regulation purposes since such light power could not be used for the signal transmission anyhow. FIG. 1 shows a circuit appropriate for this purpose.

As shown in FIG. 1, the energy required to transmit the data signal S1 over a light conductive fiber path F is generated by a laser diode LD. The above-mentioned rearward radiation S3 of this laser diode LD is collected by means of a photodiode FD and utilized, via a regulator R and possibly a series-connected amplifier stage T, to influence the current of the laser diode LD so that its output radiation S4 toward the light-conductive fiber path F is maintained constant. In the illustrated circuit S2 identifies the electrical signal which is fed to the amplifier or driver stage T in order to set the desired output power of the laser diode LD.

With such an arrangement, defects in the mirrors, which may be different on either side of the laser LD, and defects in the interior of the laser LD, may cause the energy S3 tapped out at the rear of the laser LD to be out of proportion to the useful power S4 of the laser which is radiated toward light-conductive fiber F. This means that the above-described regulation becomes ineffective.

SUMMARY OF THE INVENTION

It is therefore the object of the present invention to provide a regulation arrangement for a laser which is independent of the above-mentioned defects.

The above object is achieved according to the present invention in that in an arrangement for regulating the output power of a laser for an optical data transmission system including a light-conductive fiber coupled to a laser and through which the output signal from the laser is transmitted, and a photodiode responsive to light energy produced by the laser and whose resulting photocurrent is utilized to regulate the current of the laser; the photodiode is a thin film photodiode which is transparent for the light frequencies transmitted through the light-conductive fiber and is inserted directly into the optical path of the light-conductive fiber.

BRIEF DESCRIPTION OF THE PREFERRED EMBODIMENTS

Figure 1:
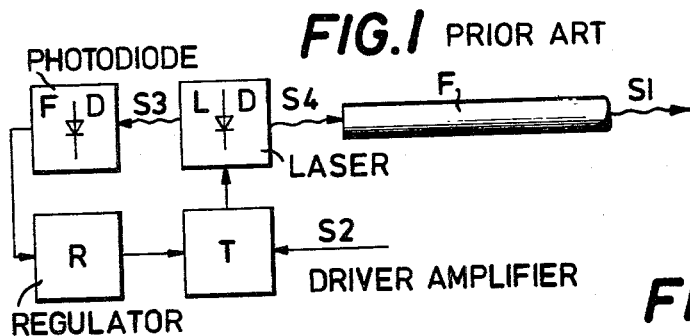
FIG. 1 is a block diagram showing an arrangement for regulating the current of a laser according to the prior art.
Figure 2:
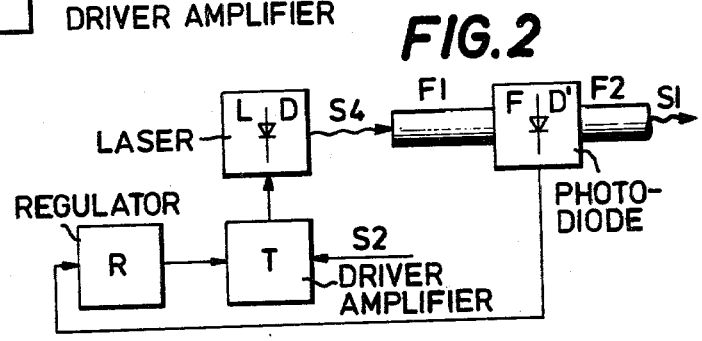
FIG. 2 is a block diagram showing an arrangement for regulating the current of a laser according to the invention.

Referring now to FIG. 2, the light-conductive fiber path includes two light-conductive fiber sections F1 and F2 between which a thin-film photodiode FD', which is transparent for the light frequencies produced by a laser LD and transmitted through the light-conductive fiber, has been inserted. As in FIG. 1, S1 is the optical signal to be transmitted, S4 is the useful radiation emanating from the laser diode LD which is coupled into the light conductive fiber section F1. The photodiode FD' is connected with a regulator R which itself is connected with the laser diode LD via the amplifying driver stage T. The net result of this circuit is that the control current generated from the photocurrent of the photodiode FD' regulates the output power of the laser diode LD to a certain value depending on the magnitude of the electrical signal S2 fed to the driver stage T.

Figure 3:
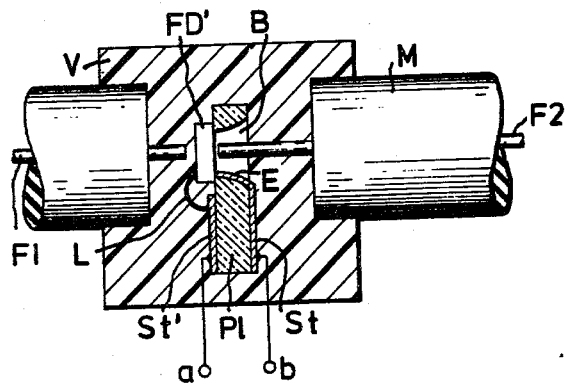
FIG. 3 is a detailed schematic elevational view, partially in section, showing the preferred arrangement for inserting the photodiode into the optical path of the light-conductive fiber according to the invention.
Figure 4:
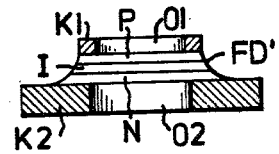
FIG. 4 is a sectional view of the preferred embodiment of the photodiode.

The photodiode FD' together with the two light conductive fiber sections F1 and F2 connected thereto are appropriately aligned and combined or mechanically connected into a structural unit. This is accomplished in that the photodiode FD' which (as shown in FIG. 4) is provided with an annular flat contact K1 or K2 on each of its opposite major surfaces, is attached to one major surface of a glass plate P1 as shown in FIG. 3. The glass plate P1 is provided with a through bore B which is disposed within and substantially aligned with the annular contacts of the photodiode FD'. One end of the section of light-conductive fiber F2, whose associated sheath is marked M, is inserted into this bore B and its end or frontal face is optically coupled with photodiode FD'. On the other side of the photodiode FD', the end of the light-conductive fiber section F1 is optically connected with the photodiode FD' in the same manner after having been appropriately adjusted. In order to contact the photodiode FD' a stripline is formed by a pair of conductive paths St and St' applied to the respective major surfaces of the glass plate P1 with the conductive path St being directly connected with one annular contact of the photodiode FD' via a conductive extension E which extends through the bore B, while the other conductive path St' is connected with the other annular contact of the photodiode FD' via a wire L. The ends of the stripline facing away from the photodiode FD' lead to two connecting points a and b which extend beyond the component marked V in FIG. 3. This component V represents a block, preferably formed of cast resin, which unites the individual elements into a mechanically compact structural unit.

As shown in FIG. 4 the thin-film photodiode FD' is preferably a PIN semiconductor photodiode which has a mesa profile and which has an annular gold contact K1 on its upper major surface and a further somewhat larger annular gold contact K2 on its lower major surface. The thus formed openings for the individual contacts K1 and K2 are marked O1 and O2, respectively. In an embodiment of such a thin-film diode which has been reduced to practice the thickness of the diode body was approximately 3μ, the diameter of the large lower opening O2 was about 85μ.

Figure 5:
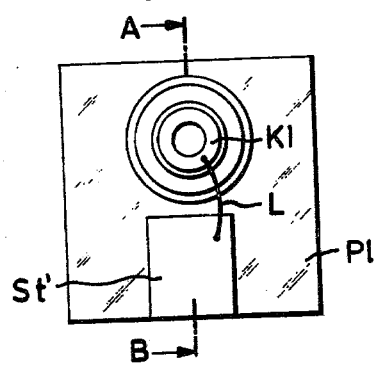
FIG. 5 is a plan view of a preferred embodiment of a photodiode mounted on the surface of a glass plate according to the present invention.
Figure 6:
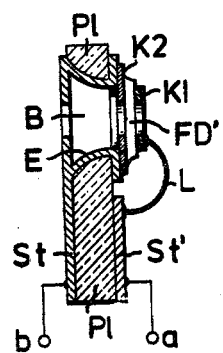
FIG. 6 is a cross section view along the line A-B of FIG. 5.

FIGS. 5 and 6 show the photodiode FD' mounted on the glass plate P1 in more detail. As can clearly be seen from FIG. 5 the annular contact K1 of the photodiode FD' is connected to the conductive path St' of the stripline, which is provided on the top surface of glass plate P1 for contacting purposes, via the welded-on conductor wire L. As shown in FIG. 6, the lower annular contact K2 of the diode FD' is connected with the second portion St of the stripline, which is disposed on the bottom major surface of the glass plate P1, by means of the conductive extension E which extends through and completely covers the surface of the plate defining the bore B and preferably, as shown, extends over a portion of the upper surface of the plate P1. The connecting points for the stripline portions St' and St are marked a and b, respectively. As mentioned above, the bore B provided in the glass plate P1 is of sufficient size and is positioned relative to the annular contacts K1 and K2 so that the end of one section of the light-conductive fiber can be passed through the bore B and connected optically with the photodiode FD' and in particular the portion thereof which is disposed within the openings of the annular contacts.

In order to avoid undesirable reflections, the optically effective surfaces of the photodiode FD' are preferably provided, in a known manner, with an antireflection coating which constitutes a λ/4 conductor for the interfering frequency. In an arrangement constructed according to the present invention, the photodiode produced a decoupling attenuation of about 1 dB, while absorbing about 10% of the useful laser power and furnishing a control voltage which was independent of the defects of the laser.

For a detailed description of the PIN diode see for example:

J. Muller et al,

Transparent Photodiodes For Optical Transmission Systems,

Third European Conference On Optical Communication,

Munich, Sept. 14–16, 1977, pp. 173–175.

It will be understood that the above description of the present invention is susceptible to various modifications, changes and adaptations, and the same are intended to be comprehended within the meaning and range of equivalents of the appended claims.

What is claimed is:

1. In an arrangement for regulating the output power of a semiconductor laser for a data transmission system including a light conductive fiber optically coupled to a semiconductor laser and through which the output signal of the laser is transmitted, a photodiode responsive to light energy produced by said laser, and means responsive to the output signal of said photodiode for regulating the current of the laser; the improvement wherein: said photodiode is a thin-film photodiode which is transparent for the light frequencies to be transmitted via said light-conductive fiber and is inserted in the transmission path of said light-conductive fiber.

2. An arrangement as defined in claim 1 wherein: said light-conductive fiber includes a pair of light-conductive fiber sections; said photodiode is disposed between and aligned with said light-conductive fiber sections and is optically coupled to one end of each of said light-conductive fiber sections; and wherein means are provided for mechanically combining said photodiode and the associated ends of said light-conductive fiber sections into a structural unit.

3. An arrangement as defined in claim 2 wherein: said photodiode is provided with an annular, flat contact on each of its two opposed major surfaces; said photodiode is mounted on one major surface of a glass plate which is provided with a through bore which is substantially aligned with said contacts; one end of one of the two light conductive fiber sections passes through said bore and is optically coupled at its frontal face with one transparent major surface of said photodiode; and the end of the other of said light conductive fiber sections is optically coupled to the other transparent major surface of said photodiode.

4. An arrangement as defined in claim 3 wherein: conductor paths are provided on both major surfaces of said glass plate for connecting said photodiode to said means for regulating with said conductor paths forming a stripline; and means are provided for conductively connecting each of said conductor paths with one of said annular contacts of said photodiode.

5. An arrangement as defined in claim 4 wherein said means for conductively connecting includes: an extension of the one of said conductive paths which is formed on the other major surface of said glass plate, said extension extending through said bore and contacting the one of said annular contacts which is on said one major surface of said glass plate; and a wire for connecting the other of said annular contacts to the one of said conductive paths which is on said one major surface of said glass plate.

6. An arrangement as defined in claim 5 wherein said photodiode is a PIN semiconductor photodiode having a mesa shaped profile.

7. An arrangement as defined in claim 6 wherein the major surfaces of said photodiode are provided with an antireflection coating.

8. An arrangement as defined in claim 1 wherein said photodiode is a PIN semiconductor photodiode having a mesa shaped profile.

9. An arrangement as defined in claim 8 wherein the major surfaces of said photodiode are provided with an antireflection coating which constitutes a λ/4 conductor for an interfering frequency.

* * * * *